(12) United States Patent
Pratt et al.

(10) Patent No.: US 8,014,737 B2
(45) Date of Patent: Sep. 6, 2011

(54) POWER CONTROL SYSTEM FOR A WIRELESS COMMUNICATION UNIT

(75) Inventors: Patrick J. Pratt, Mallow (IE); Michael A. Milyard, Chandler, AZ (US); Daniel B. Schwartz, Scottsdale, AZ (US); Philip C. Warder, Planton, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 939 days.

(21) Appl. No.: 11/722,296

(22) PCT Filed: Dec. 23, 2004

(86) PCT No.: PCT/EP2004/053691
§ 371 (c)(1),
(2), (4) Date: Jun. 20, 2007

(87) PCT Pub. No.: WO2006/066628
PCT Pub. Date: Jun. 29, 2006

(65) Prior Publication Data
US 2010/0009642 A1 Jan. 14, 2010

(51) Int. Cl.
*H01Q 11/12* (2006.01)
(52) U.S. Cl. .................................. 455/127.1
(58) Field of Classification Search ............. 455/127.1
See application file for complete search history.

(56) References Cited

U.S. PATENT DOCUMENTS

| | | | |
|---|---|---|---|
| 3,900,823 A | 8/1975 | Sokal et al. | |
| 5,150,075 A | 9/1992 | Hietala et al. | |
| 5,296,821 A | 3/1994 | Petersen et al. | |
| 5,334,979 A * | 8/1994 | Hatakeyama | 341/138 |
| 5,548,616 A * | 8/1996 | Mucke et al. | 375/295 |
| 5,675,287 A | 10/1997 | Baker et al. | |
| 5,699,383 A | 12/1997 | Ichiyoshi | |
| 6,043,707 A | 3/2000 | Budnik | |
| 6,133,789 A | 10/2000 | Braithwaite | |
| 6,169,886 B1 * | 1/2001 | Black et al. | 455/127.2 |
| 6,236,267 B1 | 5/2001 | Anzil | |
| 6,272,336 B1 | 8/2001 | Appel et al. | |
| 6,466,772 B1 * | 10/2002 | Rozenblit et al. | 455/126 |

(Continued)

FOREIGN PATENT DOCUMENTS

EP 0261967 B1 3/1988

(Continued)

OTHER PUBLICATIONS

Smith, O.J.M., "A Controller To Overcome Dead Time," ISA Journal, vol. 6, No. 2, Feb. 1959, pp. 28-33.

(Continued)

*Primary Examiner* — Yuwen Pan
*Assistant Examiner* — Ayodeji Ayotunde (57) ABSTRACT

A wireless communication unit comprises a transmitter having an analogue feedback power control loop with an input and a power amplifier having a power amplifier output, where the analogue feedback power control loop is arranged to feedback a signal to the input to set an output power level of the transmitter. The wireless communication unit further comprises an outer digital loop operably coupled from the power amplifier output to the transmitter.
In this manner, the inner analogue loop is used to linearise a response obtained from the power amplifier and an outer digital loop wherein the outer digital loop controls the inner analogue loop with regard to saturation detection and correction as well as facilitating multi-mode operation of the wireless communication unit.

22 Claims, 5 Drawing Sheets

U.S. PATENT DOCUMENTS

| | | |
|---|---|---|
| 6,657,493 B2 | 12/2003 | Ode et al. |
| 6,687,511 B2 | 2/2004 | McGowan et al. |
| 6,792,282 B1 | 9/2004 | Domino et al. |
| 6,836,517 B2 | 12/2004 | Nagatani et al. |
| 6,904,268 B2 | 6/2005 | Leizerovich |
| 7,149,482 B2 | 12/2006 | Kenington |
| 7,383,028 B2 | 6/2008 | Suzuki et al. |
| 7,409,004 B2 | 8/2008 | Booth et al. |
| 7,551,905 B2 | 6/2009 | Kubo et al. |
| 2003/0139153 A1 | 7/2003 | McMorrow et al. |
| 2003/0160656 A1* | 8/2003 | Pratt et al. ............ 330/149 |
| 2004/0196922 A1* | 10/2004 | Leffel ............ 375/297 |
| 2004/0219891 A1 | 11/2004 | Hadjichristos |
| 2005/0130595 A1* | 6/2005 | Shurvinton et al. ....... 455/67.11 |
| 2009/0280758 A1 | 11/2009 | Pratt et al. |

FOREIGN PATENT DOCUMENTS

| | | |
|---|---|---|
| EP | 0524008 A1 | 1/1993 |
| WO | 9707441 A1 | 2/1997 |
| WO | 2006066627 A1 | 6/2006 |

OTHER PUBLICATIONS

Zhang, Shuyun, Madic, Jelena, Bretchko, Pavel, Mokoro, Julius, Shumovich, Raymond, and McMorrow, Rob, "A Novel Power-Amplifier Moduel for Quad-Band Wireless Handset Applications," 2003 IEEE vol. 51, No. 11, Nov. 2003, pp. 2203-2210.

Office Action mailed Jun. 30, 2010 for U.S. Appl. No. 11/722,293, 9 pages.

Non-Final Office Action mailed Dec. 7, 2010 for U.S. Appl. No. 11/722,293, 10 pages.

* cited by examiner

POWER CONTROL SYSTEM FOR A WIRELESS COMMUNICATION UNIT

FIELD OF THE INVENTION

This invention relates to power control in a wireless communication unit. The invention is applicable to, but not limited to, improving the performance of wireless Power Amplifier control loops having a log detector.

BACKGROUND OF THE INVENTION

Wireless communication systems, for example cellular telephony or private mobile radio communication systems, typically provide for radio telecommunication links to be arranged between a plurality of base transceiver stations (BTS) and a plurality of subscriber units. An established harmonised cellular radio communication system, providing predominantly speech and short-data communication, is the Global System for Mobile Communications (GSM). GSM is often referred to as $2^{nd}$ generation cellular technology.

An enhancement to this cellular technology, termed the General Packet Radio System (GPRS), has been developed. GPRS provides packet switched technology on GSM's switched-circuit cellular platform. A yet further enhancement to GSM that has been developed to improve system capacity can be found in the recently standardised Enhanced Data Rate for Global Evolution (EDGE) that encompasses Enhanced GPRS (EGPRS). A still yet further harmonised wireless communication system currently being defined is the universal mobile telecommunication system (UMTS). UMTS is intended to provide a harmonised standard under which cellular radio communication networks and systems will provide enhanced levels of interfacing and compatibility with many other types of communication systems and networks, including fixed communication systems such as the Internet. Due to this increased complexity, as well as the features and services that it supports, UMTS is often referred to as a third generation (3G) cellular communication technology. In UMTS, subscriber units are often referred to as user equipment (UE).

Within GSM, two modes of operation (e.g. two modulation schemes) may be used, Gaussian Minimum Shift-keyed (GMSK) modulation and 8-phase shift keyed (8-PSK) modulation. GMSK is a constant amplitude phase modulation scheme whilst, for the second generation (2G) standard, 8-PSK incorporates both amplitude and phase modulation.

In such cellular wireless communication systems, each BTS has associated with it a particular geographical coverage area (or cell). The coverage area is defined by a particular range over which the BTS can maintain acceptable communications with subscriber units operating within its serving cell. Often these cells combine to produce an extensive coverage area.

Wireless communication systems are distinguished over fixed communication systems, such as the public switched telephone network (PSTN), principally in that mobile stations/subscriber equipment move between coverage areas served by different BTS (and/or different service providers). In doing so, the mobile stations/subscriber equipment encounter varying radio propagation environments. In particular, in a mobile communication context, a received signal level can vary rapidly due to multipath and fading effects.

One feature associated with most present day wireless communication systems allows the transceivers in either or both the base station and/or subscriber unit to adjust their transmission output power to take into account the geographical distance between them. The closer the subscriber unit is to the BTS's transceiver, the less power the subscriber unit and BTS's transceiver are required to transmit, for the transmitted signal to be adequately received and decoded by the other unit.

Thus, the transmit power is typically controlled, i.e. set to a level that enables the received signal to be adequately decoded, yet reduced to minimize potential radio frequency (RF) interference. This 'power control' feature saves battery power in the subscriber unit. Initial power settings for the subscriber unit, along with other control information, are set by the information provided on a beacon (control) physical channel for a particular cell.

Furthermore, in a number of wireless communication systems, the effect of fast fading in the communication channel is a known and generally undesirable phenomenon caused by the signal arriving at a receiver via a number of different paths. Therefore, fast power control loops are often adopted to rapidly determine and optimize the respective transmit power level.

It is known that, within the field of power control techniques, closed loop control systems are widely adopted but suffer from the following problems:

(i) With the power amplifier (PA) fully off, and with no radio frequency (RF) output the loop is in a highly non-linear state and cannot be controlled by a linear closed loop control system. A simple economical activation scheme, where the output power is increased to a desired minimum that will allow effective linear closed loop control, is required.

(ii) Transitioning from the activation state into the closed loop state can result in undesirable transients.

(iii) The inventors of the present invention have recognised and appreciated that the initial value of the closed loop reference can impact the switching transients. A simple and automatic mechanism for setting this initial value is required.

(iv) A raised cosine type waveform is typically employed as the reference; as it can be shown to best satisfy both the transient and spectral specifications. However, application of a log detector as the power detection mechanism will distort the desired raised cosine profile at the PA output and compromise spectral emission performance. Hence, a scheme to avoid this log distortion is therefore required.

In the area of activation/turn-on of the power amplifier (PA), it is also known that minimising transient interference is critical. It is known that some PA power control systems utilise a log detector instead of a peak detector. A log detector design provides an extended closed loop power control range as compared to a peak detector. In practice this extended range is used to simplify the activation or turn on of the PA, e.g. in general the loop can therefore be closed at a relatively lower power with a log detector compared to a peak detector.

Additionally, there is a linear relationship between output power and detected voltage (in the form of V/dBm), when using a log detector design. The linear relationship facilitates much easier calibration or phasing of the target power (PWR).

Where a peak detector is used, the activation process is non-linear and requires a more complex signal to be applied to the bias point, for example in the case of a Gaussian Minimum Shift Keyed (GMSK) bias control system. In addition, the more complex waveform used with a peak detector typically needs to be calibrated/phased in the factory with respect to output target power.

Thus, in the area of PA activation, there exists a need to turn on the PA at a sufficiently low power so that any transients that are generated do not exceed the PvT specification.

Thus, critical standards' test specifications may be failed if accurate control of ramp generation and PA activation/turn on is not achieved, such as:

(i) Power versus time (PvT), or
(ii) Out-of-band spectral emission performance.

A need therefore exists, in general, for an improved power control arrangement and method of operation, wherein the abovementioned disadvantages may be alleviated.

STATEMENT OF INVENTION

In accordance with the present invention, there is provided a wireless communication unit comprising a power control system, as defined in the appended claims.

BRIEF DESCRIPTION OF THE DRAWINGS

Exemplary embodiments of the present invention will now be described, with reference to the accompanying drawings, in which.

DESCRIPTION OF PREFERRED EMBODIMENTS

Some of the aforementioned problems are generally solved by adopting a low-latency, high-gain inner analogue loop comprising a log-detector. The log-detector simplifies the activity detection process; as detection can be performed at a much lower transmit power, for example at −10 dBm for, which allows greater range in the activity detection process.

In the case of the input power control, with an 8-PSK system, the extended log detector range allows the PA to be activated by switching out step attenuators coupled in the loop, until such time as the detected power first exceeds a desired threshold value.

A raised cosine (or similar) type of signal is applied to the reference ramp signal, as it has a minimal high frequency transient or switching content. This property is desirable in terms of satisfying the switching or transient spectrum emission specifications of wireless communication standards. The use of a log detector in the feedback path distorts the raised cosine response at the PA output; thereby having the effect of compromising the communication unit's switching emissions performance.

A log 'pre-distortion' function is therefore applied to the reference ramp signal. To preserve the raised cosine effect at the PA output Notably, in contrast to known uses of employing a predistortion with PAs to linearise the response through a PA, the preferred embodiment of the present invention predistorts the reference ramp signal used in a power control loop to overcome a problem caused by the log nature of the detector. Thus, a pre-distortion function is utilised with no consideration of the PA or with any effect on the signal information content.

In addition, with regard to the ramp generator of the preferred power control system, a constant step voltage level is applied to the inner analogue loop, whereby the magnitude of the step voltage is selected to be marginally larger than a maximum offset voltage of the log detector. By applying a step voltage level in this manner, a positive error is produced to the analogue controller. Assuming the controller has an integral action, the integrator will then integrate this error and increase in a linear fashion (i.e. slew). The bias voltage of the PA has a slew rate, that causes the PA output power, and hence the detector voltage, to increase. As the detector voltage increases to the step voltage value, the error will decrease and the slewing will 'slow' down. When the detector equals the step value, the error equals zero and the controller output will stop increasing and hold its value constant, as shown in greater detail with respect to FIG. 3. At this stage the integrator will cease slewing and thus hold the output power at a constant value. In this manner, an improved ramp generation process is achieved.

In an enhanced embodiment of the ramp generator, a mechanism of autoscaling the ramp reference, particularly when targeting high output powers from the PA, is described. The inventors of the present invention have identified that an initial value of the reference ramp affects the communication unit's switching emissions performance.

By carefully selecting this initial value the switching performance can be optimised. In contrast to the known prior art, where this initial value is typically factory phased to be xdB below the final target power value, the enhanced embodiment of the present invention proposes a use of a linear translator. The linear translator achieves an autoscaling of the ramp reference that automatically scales the reference enabling the initial value to be a programmable value below the final target power value.

When a known power control loop is closed, the loop will temporarily drive the power down, which may potentially fail to satisfy PvT and switching emissions, if the initial value of the reference is lower than the initial value of the detector. Thus, a 'bump-less transfer' from open to closed lop is required. Therefore, in an enhanced embodiment of the present invention, the initial detector value is sampled just prior to closing the loop, whereby the reference is limited to be always greater than the sample to ensure a bump-less transfer.

Figure 1:
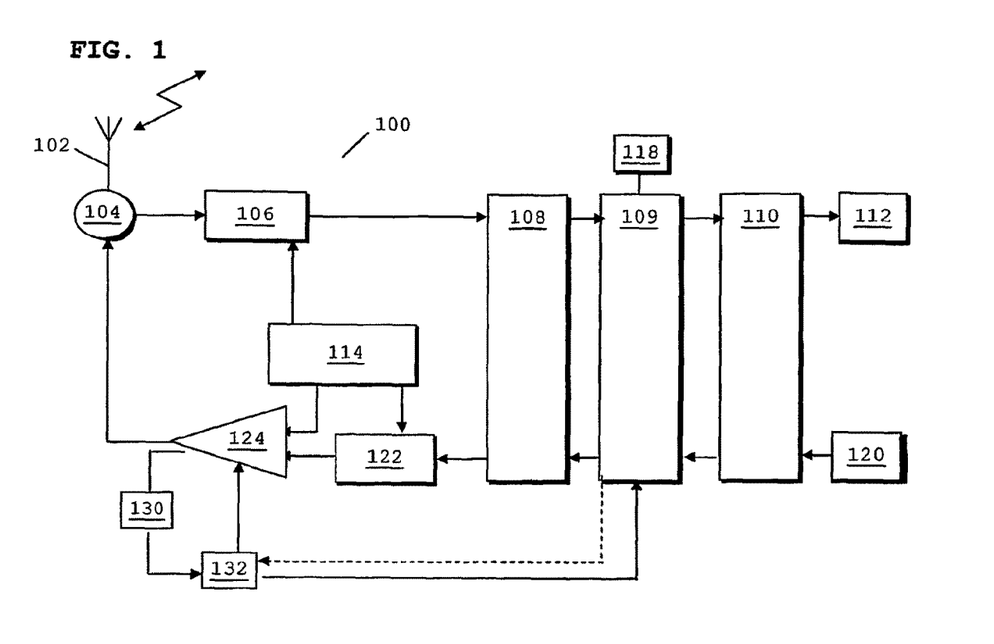
FIG. 1 illustrates a functional block diagram of a subscriber unit, adapted in accordance with various inventive concepts of a preferred embodiment of the present invention.

Referring now to FIG. 1, a block diagram of a subscriber unit, sometimes referred to as user equipment (UE) 100; adapted to support the inventive concepts of the preferred embodiments of the present invention, is illustrated. The subscriber unit 100 contains an antenna 102 preferably coupled to a duplex filter or antenna switch 104 that provides isolation between receive and transmit chains within subscriber unit 100.

The receiver chain includes receiver front-end circuit 106 (effectively providing reception, filtering and intermediate or base-band frequency conversion). The receiver front-end circuit 106 receives signal transmissions from another wireless communication unit, for example its associated Base station, associated BTS or direct from another subscriber unit. The receiver front-end circuit 106 is serially coupled to a signal processing function (generally realised by a digital signal processor (DSP)) 108. The processing function 108 performs de-interleaving, signal demodulation, error correction, data formatting, etc. of the received signal. Recovered information from the signal processing function 108 is serially coupled to a power control processing function 109, which extracts pertinent power control information from the received and decoded beacon signal and interprets the information to determine an appropriate transmit output level for the subscriber unit's transmissions.

In different embodiments of the invention, the signal processing function 108, power control processing function 109 and baseband processing function 112 may be provided within the same physical signal-processing device.

As known in the art, received signals that have been processed by the power control processing function 109 are typically input to a baseband-processing function 110. The baseband processing device 110 takes the received information formatted in a suitable manner and sends it to an output device 112, such as an audio speaker or liquid crystal display or visual display unit (VDU). A controller 114 controls the information flow and operational state of each circuit/element/function.

A timer 118 is preferably operably coupled to the entire signal processing functions to provide synchronisation in both the signal recovery and signal generation processes.

As regards the transmit chain, this essentially includes an input device 120, such as a microphone or keypad, coupled in series through baseband processor 110, a power control processing function 109, signal processing function 108, transmitter/modulation circuitry 122 and a power amplifier 124. The processor 108, transmitter/modulation circuitry 122 and the power amplifier 124 are operationally responsive to the controller 114, with an output from the power amplifier coupled to the duplex filter or antenna switch 104, as known in the art.

The transmit chain in subscriber unit 100 takes the baseband signal from input device 120 and converts this into a signal whose level can be baseband adjusted by the power control processor 109. The power control processor forwards the amplitude-adjusted signal to the signal processor 108, where it is encoded for transmission by transmit/modulation circuitry 122, thereafter amplified by power amplifier 124, and radiated from antenna 102. Clearly, the adjustment of the transmit output power can be effected by any amplitude or attenuation means in the transmit chain, and the above baseband adjustment is described as one example only.

Notably, in accordance with the preferred embodiment of the present invention, the transmitter employs a power control feature, whereby a sample of the transmitted signal is fed back to a power control function 132 via a coupler and a log detector 130. The power control function 132 is also responsive to the power control processor function 109.

The signal processor function 108 in the transmit chain may be implemented as distinct from the processor in the receive chain. Alternatively, a single processor 108 may be used to implement processing of both transmit and receive signals, as shown in FIG. 1. Furthermore, the various components within the subscriber unit 100 can be realised in discrete or integrated component form.

Furthermore, in the preferred embodiment, the majority of the power control functions are preferably implemented in a digital signal processor (DSP). However, it is within the contemplation of the invention that the power control processor circuitry described in the above embodiments can be embodied in any suitable form of software, firmware and/or hardware.

The various components within the subscriber unit 100 are realised in this embodiment in integrated component form.

Of course, in other embodiments, they may be realized in discrete form, or a mixture of integrated components and discrete components, or indeed any other suitable form.

Figure 2:
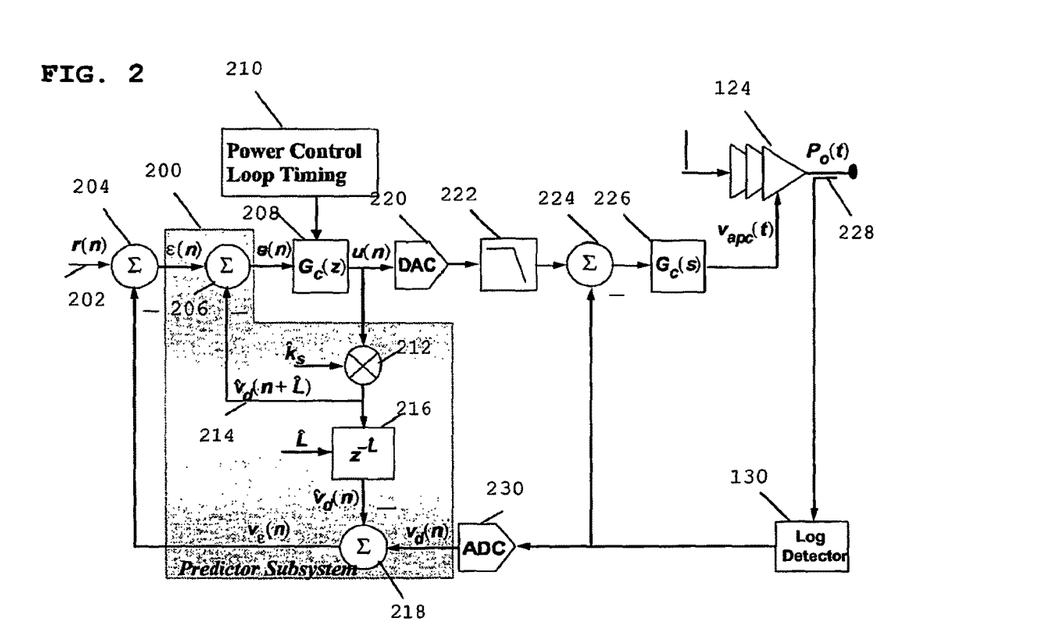
FIG. 2 illustrates a functional block diagram of a subscriber unit transmitter having a power control function adapted to operate in GMSK mode incorporating the preferred embodiment of the present invention.

Referring now to FIG. 2, a functional block diagram of a predictor sub-system 200 of the power control function 132 of a subscriber unit, adapted to incorporate the present invention, is shown in more detail. Notably, the predictor sub-system 200 has been incorporated to mitigate against loop latency limitations. The operation of the predictor sub-system is incorporated herein by reference from co-pending PCT application filed by the Applicant on the same date (with Applicant ref: SC13319EC-A) As such, the predictor aspects will not be described further here.

The power control function 132 comprises an analog inner (or minor) feedback loop, which can be used, for example, for power amplifier control when the subscriber unit is operating in a Gaussian Minimum Shift Keyed (GMSK) mode.

Notably, the feedback loop comprises a log-detector function 130 that allows the feedback loop to be closed at low (<−5 dBm) power levels. In this scenario, the inner analog loop has been incorporated to desensitize the system from 'large' variations in the control-slope of the power control signal.

Notably, the digital control system incorporates two feedback loops: an inner loop (comprising summing junction 206, controller 208 and gain stage 212) that is closed using the estimated or predicted version:

$$\hat{v}_d(n+\hat{L})$$

of the latency free detector voltage, and an outer loop (comprising summing junction 204, summing junction 206 controller 208, gain stage 212, delay 216 and summing junction 218) that is closed using a modelling or predictor error, $$v_\epsilon(n)$$

The inner digital loop can be understood in terms of ensuring satisfactory ramping behaviour. Intuitively, as this inner loop is latency free, the loop gain and bandwidth can be increased to improve system robustness. The outer digital loop can be understood in terms of rejecting disturbances and predictor/modelling errors.

Notably, these digital loops are distinct from the analog minor loop, which is described in greater detail below.

Additional transmitter sub systems, such as one designed to detect and correct for PA saturation, can advantageously remain unchanged, with the controller error:

$$e(n)$$

being used, for example, for hard saturation detection and the controller output:

$$u(n)$$

used for soft saturation detection.

Advantageously, existing threshold mechanism/values for saturation detection can be used, with the controller and integrator being frozen once saturation has been detected.

The predictor is preferably configured with 2 constants, an unsigned control-slope gain estimate:

$$\hat{k}_s$$

and an unsigned latency estimate:

$$\hat{L}$$

Both values are static and will not change from burst to burst.

Referring back to FIG. 2, an enhanced embodiment of the present invention comprises a novel use of a power activity detection mechanism with a self-activating inner $$\hat{v}_d(n+\hat{L})=0$$

and outer loop in a power amplifier that uses a log detector 130. Thus, an analogue inner loop comprises a low-pass (input ramp) filter 222 receiving an analogue output from the digital-to-analogue convertor (DAC) 220. The filter outputs the transmit signal to a summing junction 224.

Figure 3:
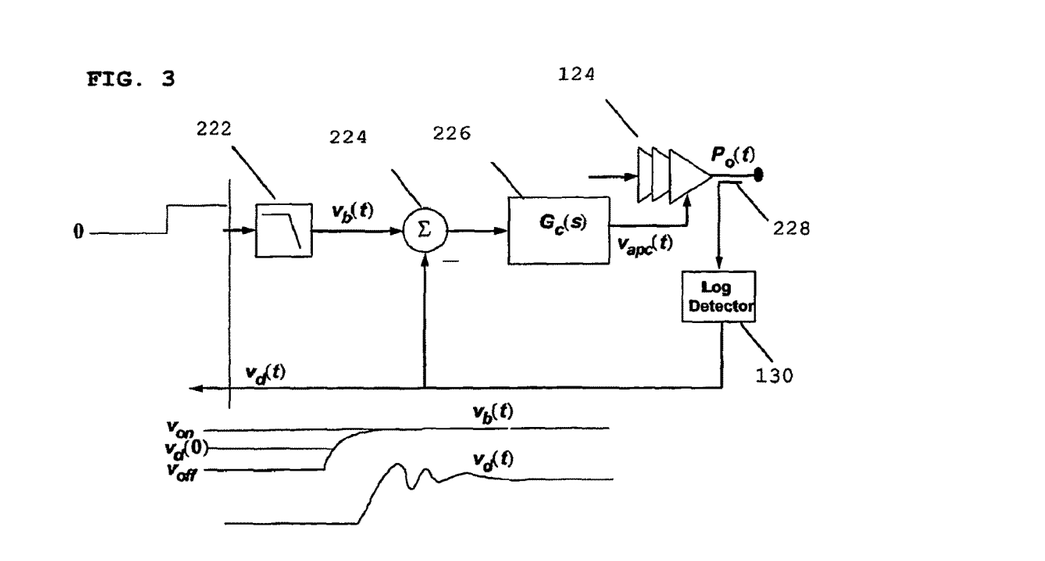
FIG. 3 shows an auto-scaled ramp-generator operation of the power control processing function of the preferred embodiment of the present invention.

Notably, referring to FIG. 3, the offset of the DAC 220:

$$v_{\text{off}}$$

is designed to be lower then the off-voltage of the log detector 130, i.e. when the (worst case) minimum power is applied to the detector, the resultant detector output voltage, $$v_d(0)$$

must be greater than the offset of the PAC DAC 220.

This creates a negative error within the inner analog loop and holds the integrator in its reset or zero state. When an associated timer expires, it is assumed that the digital controller may comprise an integral action and functionality of an accumulator, and DAC register are then loaded with a value resulting in the analog voltage. being applied to the inner analog loop reference. The value is preferably selected such that the analog voltage:

$$v_{on}$$

is greater than (the maximum)

$$v_d(0)$$

This condition triggers or activates the inner analog loop such that:

$$v_d \rightarrow v_{on}$$

with $$v_{apc}$$

and $$P_o$$

increasing from the off condition towards a nominal value of, say, −20 dBm. At the end of the burst, the integrator, which is assumed to be part of the controller Gc(s), is reset, and the analogue controller output set to zero and held there until the next burst.

Although the aforementioned description relates to a prediction-based circuit, a skilled artisan will appreciate that the inventive concepts herein described relating to PA activation and ramp generation apply equally to any analogue and digital feedback power control loop design.

The log detector 130 is nonlinear in nature. Therefore, as mentioned, a 'pre-distortion' log function is incorporated in the reference ramp generation circuit in order to minimise switching transient problems at high output power levels. The detected voltage will then track the log of the reference while the output power will actually track the antilog or linear profile of the reference, and thus follow the true profile of the reference ramp (such as ½-raised cosine reference for example).

In a GMSK mode of operation, this pre-distortion function of the reference is not essential as the inner analog loop tends to linearise the effect of the log detector.

Figure 4:
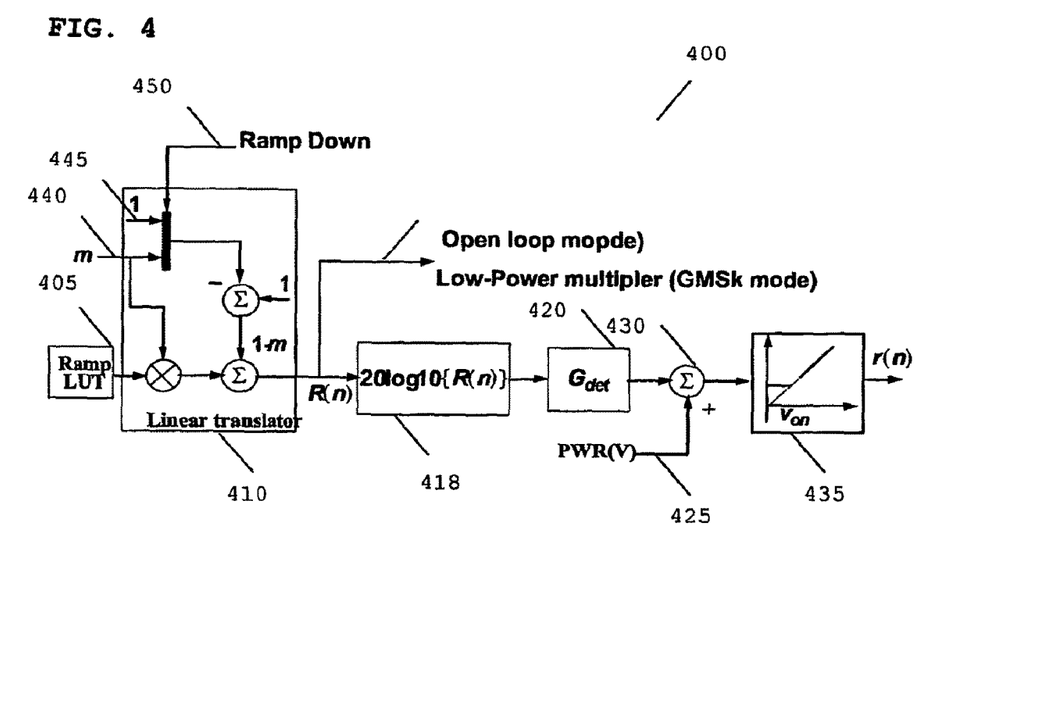
FIG. 4 shows a block schematic diagram and associated signal characteristics of the inner analogue loop in the preferred embodiment of the invention.

However, in accordance with a yet further enhanced embodiment of the present invention, an approach is presented here that includes a log pre-distortion function 415 and an auto-scaling function 410 of the reference, as illustrated in FIG. 4. Referring now to FIG. 4, the auto-scaled ramp generator function 400 of the yet further enhanced embodiment of the present invention comprises a ramp generator 405 generating a normalised ramp look-up table (LUT) (based on a ½ & ¼ wave raised cosine) signal. The reference ramp generator contains ¼ and ½ wave raised cosine profiles that are designed to ensure satisfactory PvT and switching transients where the spectral content of these ramps have minimum high frequency content. The normalised ramp signal is input to a programmable linear translator (autoscaling) function 410. The programmable linear translator (autoscaling) function 410 comprises a scaling block, to provide the necessary gain of the signal from the power amplifier output to the ADC output (in dB/V).

Thus, in operation, the normalised ramp LUT is translated linearly to extend over a programmable range depending on the variable, 'm' 440, where 'm' is simply the slope of the linearly translator 410.

The constant offset '1−m' is calculated by subtracting the slope value from unity. In GMSK mode, after the initial delay timer has expired, or when ramping down in low power mode or when the ramp down delay timer has expired when ramping down in 8-PSK mode, the slope 450 is switched to unity and the offset becomes '0'.

Thus, and notably, the output from the programmable linear translator (autoscaling) function 410 is then able to provide three distinct signals 415, dependent upon the mode of operation of the subscriber unit. A first output is applied to the pre-distorting logarithmic block 418. A second output is used in the low power GMSK mode and a third output is used in the 8-PSK mode.

The linearly translated reference ramp from the programmable linear translator (autoscaling) function 410 is then converted into a dB equivalent via the 20 log 10 (predistortion dB/V) function 418. In essence, the 20 log 10 function (pre-distortion dB/V) 418 pre-distorts the reference to compensate for the log nonlinearity of the log detector. This feature is crucial for the 8-PSK mode to provide sufficient switching transient margin. The 20 log 10 pre-distortion function 418 is not necessarily the optimal pre-distortion function for GMSK.

The output from the 20 log 10 pre-distortion function 418 is then scaled by:

$$G_{det}$$

e.g. gain function 420, which corresponds to the gain from the power amplifier output to the ADC. This relative value is then converted into an absolute value by adding the factory phased power (PWR) value 425, in adder function 430.

When targeting low-powers it is possible that the initial sampled detector voltage may exceed the initial value of the ramp. This would result in a negative error and the loop attempting to drive the power below its current setting.

For example, say after the activation of the inner analog loop, the output power is at −15 dBm. Then, for a final target power of <10 dBm when the outer loop is engaged with 25 dB autoscaling, the initial response will be to drive the power below −15 dBm.

To avoid this unnecessary transient and ensure a smooth 'bump-less' closing of the digital outer loop, the initial value of the ramp up is limited by limiter function 335 in the enhanced embodiment of the present invention. In particular, the detector voltage should be sampled prior to the digital loop closing. The ramp-up is limited such that:

$$r(n) = \begin{cases} r(n) & r(n) \geq v_{on} \\ v_{on} & r(n) < v_{on} \end{cases}$$

where $$v_{on}$$

is the sampled detector voltage prior to the outer digital loop closing.

In both GMSK or 8-PSK mode this detector voltage is sampled prior to the commencement of the closed loop ramp-up phase. This limiting feature is applied only during the ramp up sequence and disabled during the ramp-down sequence to allow the PA to ramp-down to its 'off' condition.

The inclusion of a log-detector coupled to the power amplifier results in up to 60 dB variation in control-slope, between sub-threshold and maximum power settings. Even the allowable increase in the digital gain settings (due to the predictor) may provide insufficient robustness to this gain variation. To avoid having significant factory phasing in order to calibrate out this gain variation, a high-gain, low-latency loop is placed around the PA and log-detector. The analog inner loop makes the 'activity-detect' process more reliable and again requires less factory phasing to work.

Referring back to FIG. 2, and with reference to aforementioned analog minor loop of FIG. 2, an output from the log-detector 130 is compared with the output of the DAC bias reconstruction filter 222. The resultant error is then applied to the analog controller to produce the PA bias voltage:

$v_{apc}(t)$

The 'high' integral gain ensures the necessary robustness to the control-slope variation and, in particular, provides adequate bandwidth when the control-slope is at its minimum during ramp-down from the maximum power. In the preferred embodiment of the present invention, the proportional gain introduces a phase compensating, which is necessary to avoid ringing at sub-activity during the initial ramp-up when the control-slope is at its maximum.

The aforementioned description has been targetted towards a subscriber unit capable of operating in a GMSK mode of operation. However, a number of subscriber units, for example those capable of operating in accordance with the EDGE standard, are also able to use phase-shift keyed (8-PSK) signalling. 8-PSK has both phase (frequency) and amplitude modulation, in contrast to the GMSK signal that has phase (frequency) modulation with a constant amplitude. Therefore, two different systems have been developed for 8-PSK and GMSK.

Both the 8-PSK and GMSK systems must ramp-up and ramp-down their power in a controlled fashion to meet time mask and spectral requirements. The GMSK system controls the power amplifier (PA) output power by adjusting the PA bias; often termed the bias control mode. The 8-PSK system controls the PA output power by adjusting the power of the signal at the PA input. This is often referred to as the input power control mode. In input power control mode, the PA bias is set to a constant value based on desired output power and efficiency goals.

Figure 5:
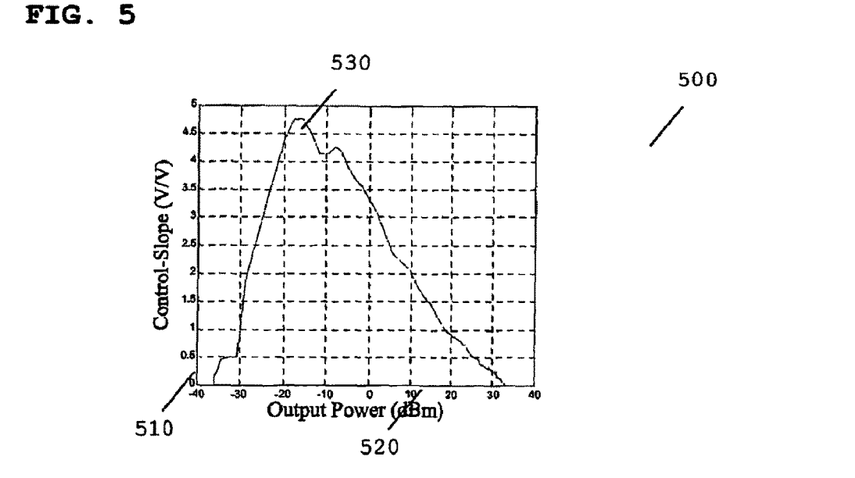
FIG. 5 illustrates a graph of control slope versus output power for a power amplifier combined with a log detector in the preferred embodiment of the present invention.

The accompanying plot in FIG. 5 shows a graph 500 of an example control-slope 510 versus output power (in dBm) 520 for a PA combined with a log detector. Closing the loop over the range of −10 dBm to 33 dBm can present a gain variation of around 60 dB. The predictor alone is unable to offer sufficient robustness to such a large variation in gain. A single gain setting of the digital controller would not be able to satisfy PvT requirements. For instance, at high power where the control-slope falls off, a 'high' controller gain setting is required to maintain the loop bandwidth and ensure satisfactory PvT during ramp-down. Conversely, at lower power, the controller gain has to be reduced. Otherwise, the 'high' control-slope 530 could cause ringing and again failure of the PvT.

To avoid such excessive factory phasing, a high-gain, low-latency analogue loop is placed around the PA, coupler and detector. Moreover, this loop will be closed permanently (whilst in GMSK mode), such that the activity detect is also performed in a closed loop fashion. Again, the motivation being a much more robust activity-detect behaviour.

The requirements for the analog controller can be stated as follows:
(i) It must provide a sufficiently high gain to maintain the bandwidth during ramp-down from high power settings, and
(ii) It must provide sufficient gain-phase margin that ramping-up is not problematic.

A classical two-term PI controller can adequately meet this requirement. This has the general form of:

$$G(z) = \frac{k_i}{s} + k_p = \frac{k_p(s + k_i/k_p)}{s}$$

The integral gain term is chosen primarily to ensure adequate loop gain for the ramp-down condition. The proportional gain term is then selected to introduce a zero at a specific location, so as to maintain the gain-phase margin.

Let us consider a simplified, small signal block diagram of the closed loop AOC system without the predictor. The controller, $G_C(z)$ uses integral action only. The small signal response of the inner analog loop, (including the PA, coupler, detector and controller) is modelled by:

$$G(s) = \frac{G_c(s)G_{rf}(s)k_s}{1 + G_c(s)G_{rf}(s)k_s}$$

where the analog controller is:
$G_C(s)$
and the small signal ac response of the PA is:
$G_{rf}(s)$
and the detector is:
$V_{det}/V_{apc}$ The small signal dc gain from the bias to the detector is modelled by the control-slope, $k_s$ The ADC is modelled as an ideal sampler.

A skilled artisan will appreciate that such configurations and values are only examples, and any number of other configurations and values may be used to benefit from the inventive concepts described herein.

Writing the open loop transfer as:

$$G_{ol}(z) = G_c(z)G_p(z)(1+\Delta)$$

where
$G_p$
is the combined transfer function of the analog inner loop, converters and filters, and
$1+\Delta$
represents the variation in inner analog loop due, primarily, to control-slope variation.

This allows the closed loop to be expressed as:

$$\frac{V_{det}}{R} = \frac{G_c(z)G_p(z)(1+\Delta)}{1 + G_c(z)G_p(1+\Delta)}$$

An underlying tenet of closed loop control can be employed to desensitise the system from slope variation by having:

$|G_{OL}| \to \infty$

However, this ideal is achievable only over a restricted bandwidth as loop stability must also be ensured. This restriction in bandwidth fundamentally limits the robustness of the loop in addition to disturbance rejection and reference tracking. Typically the loop must be designed such that:

$|G_{OL}| \geq 1$

For:

$\arg\{G_{OL}\} \geq -145°$ and:

$|G_{OL}| < 1$ for:

$\arg\{G_{OL}\} < -145°$ i.e. a 35-degree phase margin.

The source of this limitation can be traced back to the excessive loop latency within the system with the primary contributors being the ADC and DAC conversion times the reconstruction and anti-aliasing filter and the small signal ac phase response through the control path of the PA and detector. This latency results in the loop phase response decreasing from −90° (set by the integrator of the controller) towards −180° at a restrictively low BW, e.g. 100 kHz. Besides reducing the latency, an alternative control algorithm is required that will maintain the phase response above −180° for a much 'larger' bandwidth.

The inner analog loop on its own offers adequate robustness to the range of expected variations, as a low gain, single setting of the digital integrator would suffice. In fact, the analog loop alone, without any outer digital loop, would be sufficient. However, as the existing digital interface is needed for ramp generation and saturation detection plus correction, the existing digital controller augmented by the predictor is used to enhance the overall robustness of the system. The inner analog loop is not used for the 8-PSK mode of operation. The extra overhead arising from the introduction of a predictor is minimum as the same hardware is needed for the 8-PSK mode.

Figure 6:
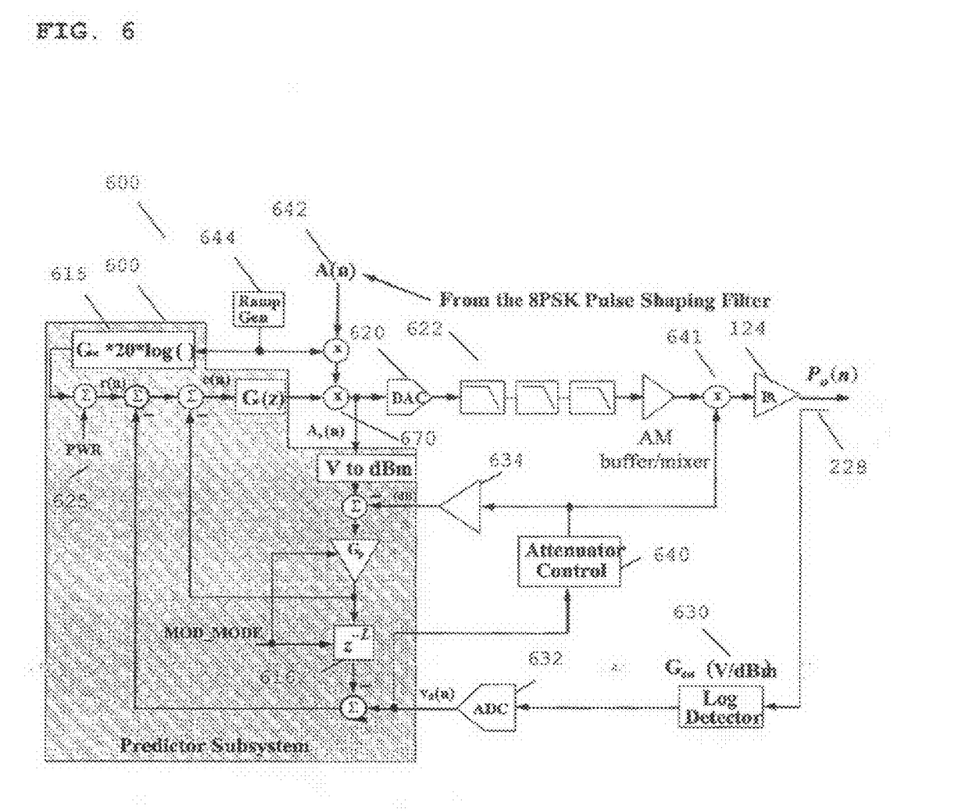
FIG. 6 illustrates a functional block diagram of a subscriber unit transmitter having a power control function and a predictor sub-system adapted to operate in an 8-PSK mode incorporating the preferred embodiment of the present invention.

Referring now to FIG. 6, a functional block diagram of a predictor sub-system 600 of a subscriber unit 100, adapted to incorporate a further embodiment of the present invention, is shown in more detail. Again, a power control function comprises an analog inner feedback loop, which can be used, for example, for power amplifier control when the subscriber unit is operating in a 8-phase shift keyed (PSK) mode.

The configuration in FIG. 6 is similar to that described in FIG. 2 for a GMSK mode, as a number of components are re-used in both modes. Hence, for those components whose operation is the same as that described in FIG. 2, no additional description will be provided herein. Again, the feedback loop preferably comprises a log-detector function 130 that allows the feedback loop to be closed at low (<−6 dBm) power levels. The power control function (i.e. power control function 132 of FIG. 1) comprises a predictor sub-system 600, which will not be further described here, as indicated earlier.

It is noteworthy that the analogue inner loop is disabled in 8-PSK mode.

In an 8-PSK mode, a signal A(n) 642 is the amplitude portion of the 8-PSK modulated signal. Other signals are the same as described for the GMSK mode in FIG. 2. Thus, the difference in the predictor for transmitter operation in the 8-PSK mode are in its control input $A_o(n)$ and the estimates for the gain and delay. Preferably, the control input $A_o(n)$ 642 includes the effects of the amplitude data, as scaled by the ramp generator 640.

Contrary to the GMSK mode, the PA bias is not manipulated, i.e. it is actually held constant in 8-PSK mode. Instead the gain of the AM signal is manipulated to affect the desired output power.

The autoscaled, predistorted reference ramp waveform is used as a reference for the loop, while a normalised ramp is used to profile the AM input via DAC 620. In fact, during the ramp-up phase the amplitude modulated (AM) signal, A(n) 642 is held approximately constant.

The 8-PSK system performs ramp-up using an open-loop ramping phase followed by a closed loop ramping phase. Prior to transmitting an 8-PSK burst, the system must perform an open loop ramping operation. The operation is performed using a step attenuator control 640, which is located between the analog loop and the outer digital loop. A sample of the RF power from the PA 124 is taken by the directional coupler 228 and input to log detector 630. The analogue signal output from the log detector 630 is then input to the ADC 632 and the digital output attenuated and fed to an AM buffer stage 634 in the feedback loop of the outer digital loop. The main purpose of the step attenuator control 640 is to provide extra dynamic range for the system so that the AM buffer only needs to be able to provide a ramping range of approx. 20 dB during the closed loop ramp-up phase.

A number of step attenuators may be used. A default step attenuator value is set at maximum attenuation, and reduction of attenuation is done in, for example, 3 dB steps. Note that the step attenuator control 640 may also be used in GMSK mode, where the step attenuator control 640 is programmed to its minimum attenuation setting to provide maximum power at the PA input. No ramping of the step attenuator is performed in GMSK mode.

The basic sequence of events for the step attenuator control 640 in 8-PSK mode is as follows. First, the step attenuator 640 is programmed to an initial value and a control sequence commenced, say approx. 18 usec, prior to the first data bit being transmit. A specified delay, say of about 21 clock cycles in 8-PSK mode, is expected before a change in step attenuation is seen at the detected signal at the output of the ADC 632.

If the detected signal is greater than the desired detected power for the beginning of the closed loop ramp-up, usually 20 dB below the PWR setting. The step attenuation value is then held for a period of time. Otherwise, the step attenuation is reduced by 3 dB and the specified delay is then re-enacted. Once the step attenuation control is complete, a closed loop ramp-up process using the AM buffer 634 commences.

A major function of the 8-PSK PAC system design is the performing of the closed loop ramp-up. The output power at the beginning of this stage is typically set to be 20 dB below the final output power. The final output power can be determined from the setting for PWR. The ramp range is programmable and of the order of 20 dB. Notably, the 8-PSK system for closed loop ramp-up utilises an integrator controller with the Predictor 600. The output of the integrator is used to adjust the gain of the amplitude path.

In an 8-PSK operational mode input power control is performed along the AM path, to effect power regulation. This is in contrast to the GMSK mode that uses bias control.

The input power is manipulated at two nodes within the loop; first at the input to the PA 124 via a digitally controlled step attenauator 660 and at the AM DAC input via a digital gain/multiplier function 670.

An attenuator algorithm (as explained above) brings the output power from an 'off' state to approx −20 dB below the final target power. This is achieved in an open loop mode with the digitally, predictor-based controller turned 'off'. When the attenuator terminates and approximately 10 uS before the $1^{st}$ valid data symbol is transmitted, the digital predictor loop is closed and the power is ramped up to the desired target power.

Again, contrary to the GMSK mode, the PA bias is not manipulated, for example, it is actually held constant in 8-PSK mode. Instead the gain of the AM trajectory is manipulated to effect the desired output power.

The autoscaled, predistorted reference ramp waveform is used as a reference for the loop while a normalised ramp is used to profile the AM input via DAC 620. In fact, during the ramp-up phase the amplitude modulated A(n) 642 is held constant.

After ramp-up, and during the modulation process, the loop opens with the controller 'frozen' or held constant. The AM signal 642 becomes constant. However, the true 8-PSK AM trajectory is scaled by the constant control output and applied to the AM DAC 620 and suitably filtered, via filters 622. Phase modulation is achieved via the AM buffer.

After modulation and during ramp-down the loop remains open in that the controller remains constant. The ramp-down is effected by using the normalised reference ramp output to scale the AM trajectory via 620. This will then bring the AM path down in a raised cosine manner. It is noteworthy that the inner analog loop is also disengaged during 8-PSK mode.

During the active part of the burst, the GMSK system remains in a closed-loop operation, to keep the PA running at maximum efficiency. Since 8-PSK data has amplitude modulation, the 8-PSK system runs open-loop and does not attempt to track PA variations over a timeslot. At the end of a burst, the GSMK system remains in a closed-loop mode and ramps down the power by reducing the PA bias. However, the 8-PSK system remains open loop and the ramp generator ramps down the amplitude signal to zero. Then the step attenuator control 640 is programmed back to maximum attenuation to prepare for the next burst.

Figure 7:
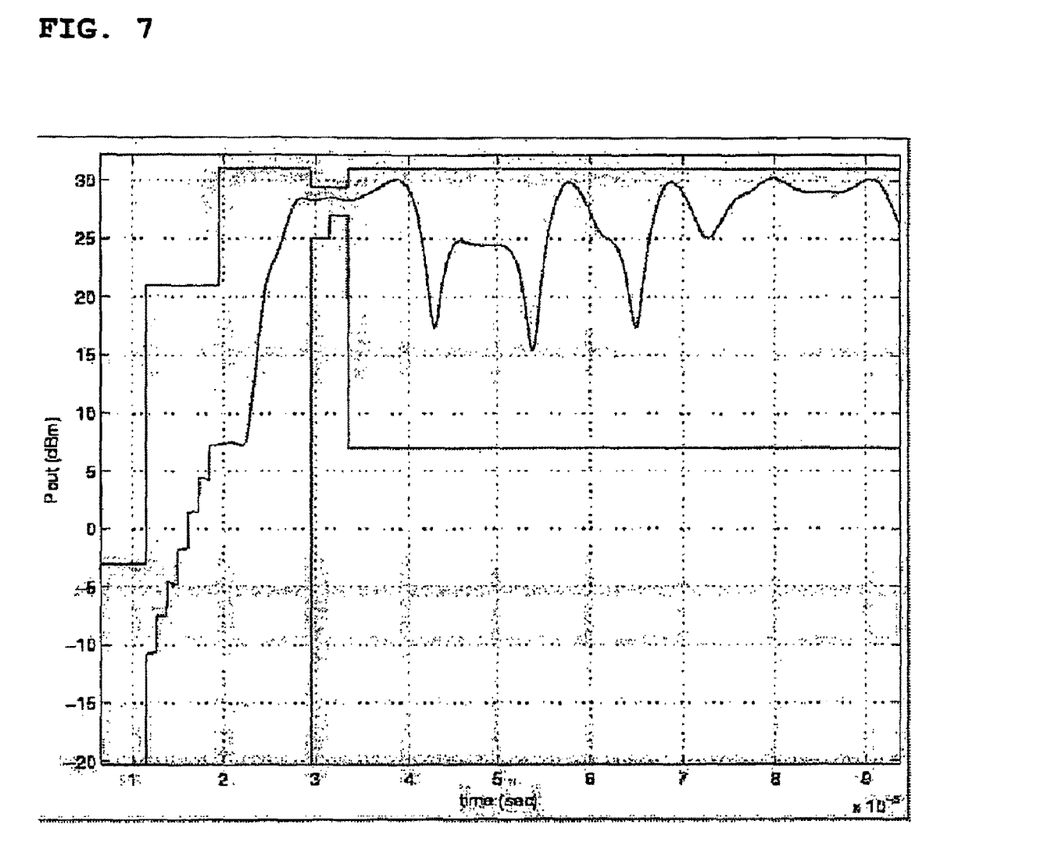
FIG. 7 illustrates an 8-PSK ramp-up diagram indicating an open loop/closed loop ramping operation in an enhanced embodiment of the present invention.

In an 8-PSK mode, a signal A(n) 642 is an amplitude portion of the 8-PSK modulated signal. Other signals are the same as described for the GMSK mode in FIG. 2. Thus, in an 8-PSK mode, the control input $A_o(n)$ and the estimates for the gain and delay are used. Preferably, the control input A(n) 642 includes the effects of the amplitude data, as scaled by the ramp generator 640. FIG. 7 illustrates an 8-PSK ramp-up diagram indicating an open loop/closed loop ramping operation when employing the inventive concepts hereinbefore described.

As previously mentioned, it is within the contemplation of the invention that many circuit configurations can be implemented that could benefit from the inventive concepts herein described. For example, there is no need for an inner analogue loop as exemplified by the 8-PSK embodiment. Furthermore, the predictor gain need not necessarily be a constant as the gain could be changed, for example, depending on the target power. Similarly, the predictor latency need not necessarily be a constant and can be arranged, for example, to be dependent upon target power, frequency setting, etc.

Thus, in summary, a new multi-loop power control system has been described whereby the power control system preferably comprises an inner analogue loop and an outer digital loop. The inner analogue feedback power control loop is arranged to feedback a signal to the input to set an output power level of the transmitter. The inner analogue loop also linearises a response output from the power amplifier, for example, linearise for any distortion between a bias point of the power amplifier and a detector. The outer digital loop controls the inner analogue loop with regard to saturation detection and correction as well as providing a simpler mechanism for supporting multi-mode operation.

Preferably, in the context of reference ramp generation, a step voltage level is applied to the inner analogue loop, where a magnitude of the step voltage is larger than a maximum offset voltage of, say, the log detector. The magnitude of the step voltage is arranged to create a positive error within the analogue loop. This mode of operation for ramp generation is particularly suited to GMSK within a GSM communication system.

In an enhanced embodiment, the multi-loop arrangement comprises a detector in a feedback path. The detector is preferably a log detector. However, it is envisaged that other detectors, such as peak detectors, could also benefit from the inventive concepts described herein. The inner analogue loop is used to linearise a response between the bias point of the power amplifier and the detector. The outer digital loop is arranged to control the inner analogue loop with regard to saturation detection and correction. Furthermore, the provision of the outer digital loop enables multi-mode operation to be more easily supported.

Preferably within an 8-PSK context, a further embodiment has been described whereby a digital outer control loop comprises a detector, a controller and a digital to analogue converter operably coupled to the digital outer control loop. The digital outer control loop comprises a number of step attenuators within the digital outer loop. A power amplifier output is detected by the detector and the power amplifier is activated by the controller by stepping out attenuators to increase a power output from the power amplifier in a step like manner until such time as a detected power level exceeds a desired threshold value.

Furthermore, a novel method of activity detection has been described. In this context, a wireless communication unit comprises a transmitter a power control loop with an input, a power amplifier having a power amplifier output and a log-detector located within a feedback path of the power control loop and operably coupled to the power amplifier output. A reference ramp generator is operably coupled to a linear translator and a log predistortion function that are arranged to counteract a distortion effect of the log detector in autoscaling a ramp reference signal.

Notably, in this context, the concept of power amplifier predistortion is not applied to the signal to be transmitted, as is the case in the known art. In this context, a predistortion is applied to the 'power of the signal' as compared to the 'information' contained within the signal.

It will also be appreciated by a skilled artisan that the inventive concepts are not limited to a 3G or 2.xG wireless communication device, but are applicable to any wireless communication device that utilizes power control.

It is envisaged that the aforementioned inventive concepts may also be applied to a large number transceiver architectures and platform solutions, i.e. a semiconductor manufacturer may employ the inventive concepts in a design of a stand-alone RFIC and/or application specific integrated circuit (ASIC) and/or any other sub-system element.

It will be understood that the method and arrangement for closed-loop power control described above provides at least one or more of the following advantages:

(i) Enhanced robustness to process, temperature, frequency and ageing variations;
(ii) Simplified and more robust activation;
(iii) Log predistortion and autoscaling of reference improves switching transients; and
(iv) Multimode operation (i.e. GMSK and 8-PSK modes).

Hence, the aforementioned method and arrangement for providing power control substantially negates at least the aforementioned problems associated with autoscaling and activity detection.

Whilst specific, and preferred, implementations of the present invention are described above, it is clear that one skilled in the art could readily apply variations and modifications of such inventive concepts.

Thus, a wireless communication having a power control system has been described wherein the aforementioned disadvantages associated with prior art arrangements have been substantially alleviated.

The invention claimed is:

1. A wireless communication unit comprising:
a transmitter;
a power control loop with an input;
a power amplifier having a power amplifier output; and
a log-detector, located within a feedback path of the power control loop and operably coupled to the power amplifier output;
wherein the wireless communication unit further comprises:
a reference ramp generator operably coupled to a linear translator; and
a log predistortion function that are arranged to counteract a non-linear distortion effect of the log detector in autoscaling a ramp reference signal.

2. A wireless communication unit according to claim 1 further characterized in that the ramp reference signal is a raised cosine type reference ramp signal, whereby the log detector distorts the raised cosine response sampled from the power amplifier output.

3. A wireless communication unit according to claim 1 further characterized in that an initial value of approximately −20 log 10 (m) below a final target power value, where m is a user programmable value, is used as the ramp reference signal.

4. A wireless communication unit according to claim 3 further characterized in that the determined initial value is set automatically following scaling of the ramp reference signal.

5. A wireless communication unit according to claim 3 further characterized in that the initial value of the reference ramp signal is used to commence autoscaling of a ramp reference when targeting high output powers from the transmitter.

6. A wireless communication unit according to claim 3 further characterized in that the initial value of the reference ramp is detected by the log detector by sampling the power amplifier prior to closing the power control loop.

7. A wireless communication unit according to claim 1 further characterized in that the ramp reference signal is set to be greater than the power amplifier sampled voltage thereby providing a smooth closing of the power control loop.

8. A wireless communication unit according to claim 1 further characterized in that the wireless communication unit operates in an 8-PSK mode of operation.

9. A wireless communication unit comprising:
a transmitter, the transmitter further comprising;
a power amplifier having a power amplifier output and an output power level input;
an inner analogue feedback power control loop including a log detector coupled to the power amplifier output, wherein the inner analogue feedback power control loop is arranged to feedback a signal to the output power level input to set an output power level of the power amplifier output; and
an outer digital loop operably coupled to the power amplifier output; and
a log predistortion function that is arranged to counteract a non-linear distortion effect of the log detector.

10. A wireless communication unit according to claim 9 further characterised in that the outer digital loop is further arranged to control the inner analogue loop with regard to saturation detection.

11. A wireless communication unit according to claim 9 further characterised in that the outer digital loop is further arranged to control the inner analogue loop with regard to saturation correction.

12. A wireless communication unit according to claim 9 further characterised in that the outer digital loop is arranged to support multimode operation of the wireless communication unit.

13. A wireless communication unit comprises:
a transmitter, the transmitter further comprising;
a power amplifier having a power amplifier output; and
a digital outer control loop having a detector coupled to the power amplifier output, a controller, and a digital to analogue converter operably coupled to the digital outer control loop,
wherein the digital outer control loop comprises a number of step attenuators within the digital outer loop, the step attenuators being operable to attenuate a feedback signal of the digital outer control loop provided to the power amplifier, where the power amplifier output is detected by the detector and the power amplifier is activated by the feedback signal, where the controller stepping out the step attenuators operates to increase the feedback signal, thereby increasing a power output from the power amplifier in a step like manner until such time as a detected power level exceeds a desired threshold value; and
a reference ramp generator operably coupled to a linear translator.

14. A wireless communication unit according to claim 13 further characterised in that the desired threshold value is associated with a code of the digital to analogue converter output.

15. A wireless communication unit according to claim 14 further characterised in that the analogue to digital code corresponds to a relative target power below a desired output power level.

16. A wireless communication unit according to claim 13 further characterised in that once the detected power level exceeds the desired threshold value the digital outer loop is closed and a raised cosine reference ramp signal is initiated.

17. A wireless communication unit according to claim 9 further characterized in that a step voltage level is applied to the inner analogue loop, where a magnitude of the step voltage is larger than a maximum offset voltage of the log detector.

18. A wireless communication unit according to claim 17 further characterized by a detector whereby the magnitude of the step voltage creates a positive error within the inner analogue loop.

19. A wireless communication unit according to claim 17 further characterized in that a step voltage level is not applied to the inner analogue loop to create a negative error within the inner analogue loop to maintain the power amplifier in an off-state.

20. A wireless communication unit according to claim 17 further characterized in that a magnitude of the step voltage level is selected to equate to a low power output level of the power amplifier.

21. A wireless communication unit according to claim 20 further characterized in that a magnitude of the step voltage level is selected to be a approximately-10 dBm for a wireless communication unit operating in a Gaussian Minimum Shift Keyed mode of operation for GSM communication.

22. A wireless communication unit according to claim 13 further characterized in that once the detected power level exceeds the desired threshold value the digital outer loop is closed and the reference ramp generator initiates a raised cosine reference ramp signal.

* * * * *